United States Patent [19]
Burton

[11] Patent Number: 5,128,562
[45] Date of Patent: Jul. 7, 1992

[54] MEMORY ELEMENT WITH HIGH METASTABILITY-IMMUNITY

[75] Inventor: Edward A. Burton, Lindon, Utah

[73] Assignee: North American Philips Corporation, Signetics Division, Sunnydale, Calif.

[21] Appl. No.: 630,095

[22] Filed: Dec. 19, 1990

[51] Int. Cl.[5] .................................. H03K 19/003
[52] U.S. Cl. ................................ 307/480; 307/443; 307/446
[58] Field of Search .............. 307/443, 446, 480, 291, 307/272.2

[56] References Cited

U.S. PATENT DOCUMENTS

| | | | |
|---|---|---|---|
| 4,719,373 | 1/1988 | Masuda et al. | 307/446 X |
| 4,845,386 | 7/1989 | Ueno | 307/443 X |
| 4,929,850 | 5/1990 | Breuninger | 307/443 X |
| 4,963,772 | 10/1990 | Dike | 307/480 |
| 4,983,862 | 1/1991 | Suzuki et al. | 307/446 |
| 4,999,528 | 3/1991 | Keech | 307/443 X |
| 5,047,669 | 9/1991 | Iwamura et al. | 307/443 X |

Primary Examiner—David Hudspeth
Attorney, Agent, or Firm—R. Meetin; A. Tamoshunas; J. Haken

[57] ABSTRACT

In a memory element comprising interconnected logic gates with field effect transistors metastable states are to be avoided. The device's immunity against staying in metastable states is considerably raised by coupling a supply terminal of each logic gate to a power supply voltage via a base-emitter path of a bipolar transistor that has its collector coupled to the logic gate's output.

11 Claims, 2 Drawing Sheets

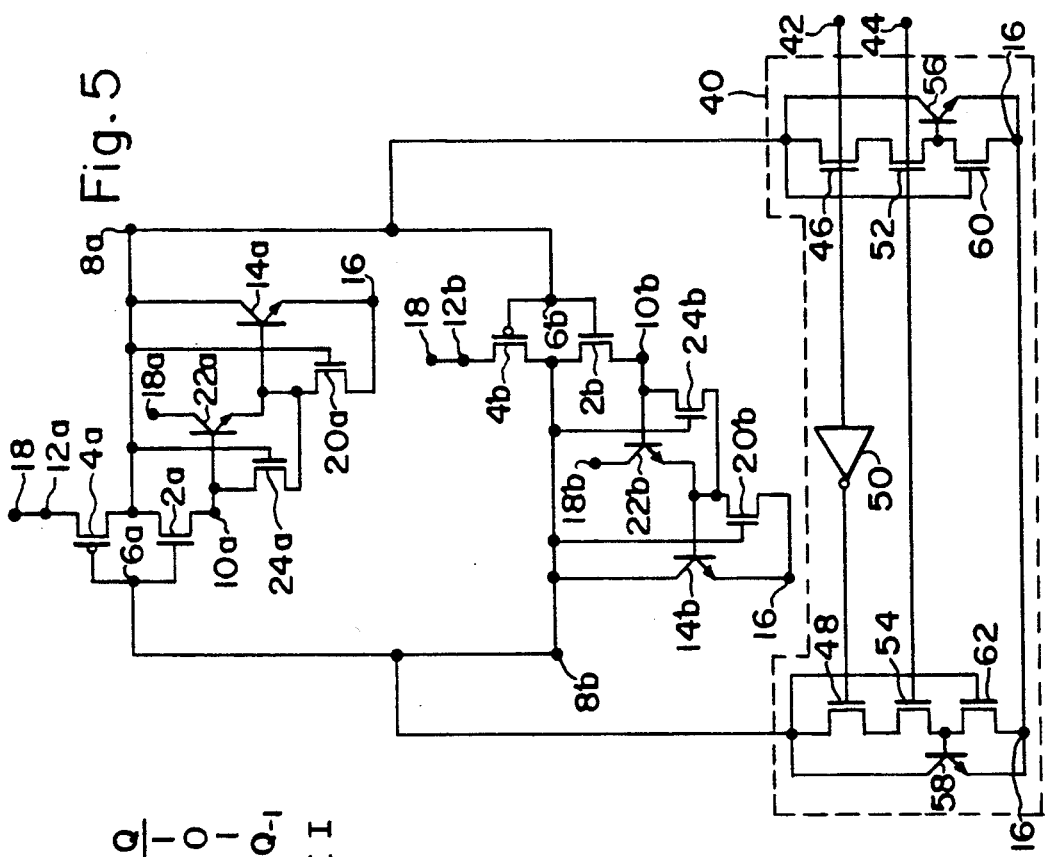
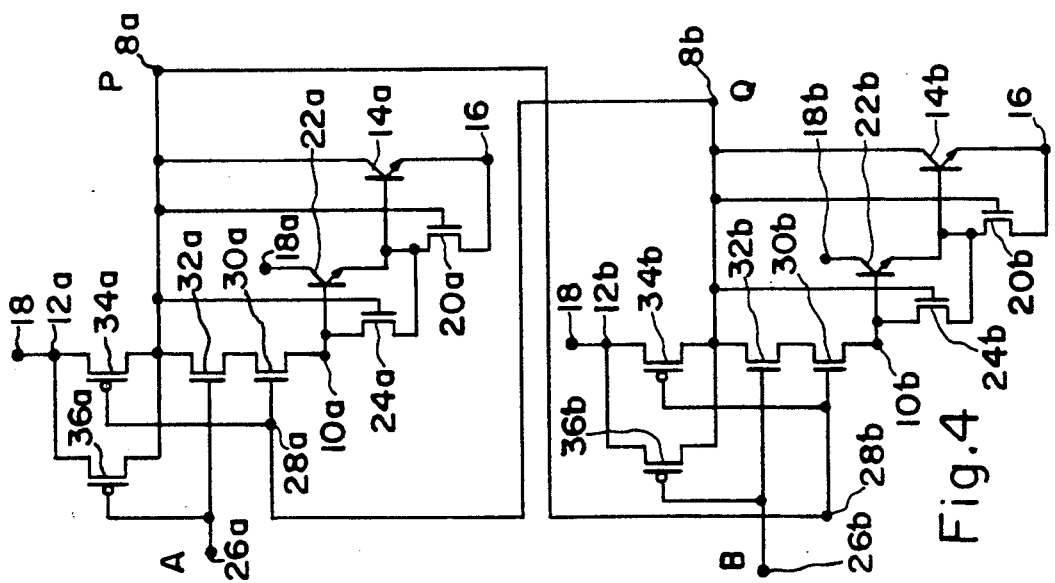

MEMORY ELEMENT WITH HIGH METASTABILITY-IMMUNITY

FIELD OF USE

This invention relates to an electronic circuit with a memory element comprising at least two logic gates that each have an output coupled to an input of the at least one other gate. Each gate includes field effect transistors (FETs) arranged in series between first and second gate supply nodes that are respectively coupled to first and second circuit supply nodes for respectively receiving first and second supply voltages. More particularly, the invention relates to such an electronic circuit comprising a latch or an arbiter (temporal priority decoder).

BACKGROUND ART

A memory element is a widely used digital circuit and occurs, for instance, as a latch implemented with two cross-coupled inverters, or as an arbiter (temporal priority decoder) implemented with cross-coupled NAND gates or NOR gates that supply an output signal indicative of which of a plurality of input signals was the first one to arrive at an input of the arbiter.

In digital circuitry a signal has to assume one of two logic values in order to be processed correctly. Therefore, any in-between signal value should be avoided during a time span that is sufficiently long for a receiving circuit to react thereon. A reaction by the receiving circuit on a signal with an in-between value would lead to ambiguous circuit states and erroneous data processing.

A common problem with digital memory elements is that they are often unavoidably given ambiguous control signals. For example, an arbiter might be asked to tell which of two simultaneous signals arrived first, or a latch might be asked to store data which is in transition. This leads to what is commonly referred to as a metastable state, in which the memory element is balancing at a point of unstable equilibrium.

The behavior of such a cross-coupled device with regard to its immunity against staying in an indeterminable state can be visualized with the help of the following thought experiment. Initially, outputs of the device will be interconnected in order to let the circuit settle at a trip-point of the cross-coupled device. Thereupon the outputs are to be disconnected in order to let the element resolve into one of its logic states. The time it takes to settle into a logic state is a measure of the circuit's immunity to such metastable states: the shorter this time, the better its immunity.

In view of the ever decreasing signal propagation times in VLSI-circuits due to higher clock rates and smaller datapath features, this settling time should be as short as possible. Cross-coupling the logic gates through comparatively large output buffers located at the output of each logic gate would indeed increase the driving force of each. However, each buffer would also entail a higher capacitance to be charged or discharged and therefore to a longer settling time. Alternatively, increasing the transistors, sizes in each gate would indeed lead to larger currents to charge and discharge the gates, output nodes. However, this advantage would be offset by the increased capacitive load at these nodes due to the larger transistors.

OBJECTS OF THE INVENTION

It is therefore an object of the invention to provide an electronic circuit of the above kind that is highly immune to metastability, i.e., that rapidly resolves into a stable state when put into a metastable state. Another object of the invention is to provide a latch and an arbiter with extremely good metastability characteristics. A further object of the invention is to provide a high-speed data processing electronic circuit.

GENERAL DISCLOSURE OF THE INVENTION

According to the invention the memory element comprises at least two logic gates that each one have an output coupled to an input of at least one other gate. Each gate includes field effect transistors (FETs) arranged in series between first and second gate supply nodes that are respectively coupled to first and second circuit supply nodes for respectively receiving first and second supply voltages. Each gate has the first gate supply node coupled to the first circuit supply node via a base-emitter path of a bipolar transistor, that has a collector coupled to the gate's output.

Upon a signal transition of a predetermined polarity at the input of the logic gate an initial output discharge current functions as a base current for the bipolar transistor. The bipolar transistor thereupon drains off a much larger output node discharging current. In this way the gain of the individual logic gate has been increased considerably without introducing relevant propagation delays. In the interconnected-gate structure this architecture highly benefits the structure's immunity to metastability.

If each logic gate has P-channel FETs and N-channel FETs, for instance in CMOS logic gates, the bipolar transistor preferably is an npn transistor having the base electrode coupled to a source electrode of a logic gate's N-channel FET. Preferably, at least one P-channel transistor, that has its drain electrode connected to the gate's output node and that has its control electrode coupled to the output node of another gate, has an optimized driving capability.

The term "optimized" will now be explained. As the P-channel transistor's size is increased, its driving capability increases more rapidly than the total capacitance of the node being driven. Consequently, increasing the size of the P-channel transistor will speed up high-going transitions. On the other hand, low-going transitions will slow down with increasing P-channel transistor size. The optimized size is found when an incremental change in size produces changes in high-going and low-going speed which are substantially the same magnitude and thus cancel each other.

A current amplifier may be arranged between the first gate supply node coupled to the bipolar transistor and the base-emitter path for amplifying the base current of the bipolar transistor. This increases the gain of the individual logic gate, thereby giving rise to a faster resolution of metastable events. For instance, the current amplifier may include at least one further bipolar transistor that has its base-emitter path arranged between the first gate supply node and the base of the first-mentioned bipolar transistor. Its collector may be coupled to the second circuit supply node. Alternatively, the further bipolar transistor may form a Darlington structure with the first-mentioned transistor.

Preferably, pull-off means are coupled between the base electrode of each bipolar transistor present and the first circuit supply node for selectively rendering the bipolar transistor inactive. For instance, for each bipolar transistor present, the pull-off means may include a main current path of a pull-off transistor controlled by the output and coupled between the base of the respective bipolar transistor and the first circuit supply node. This coupling may either be indirect, that is, through the main current path of the pull-off transistor associated with another one of the bipolar transistors present, or direct. The pull-off current conducted by this pull-off transistor needs to be small as will be explained later on. The indirect coupling is to be preferred since it entails a lower voltage across the channel of the relevant pull-off transistor than in the direct coupling, and therefore a lower current.

Alternatively, the pull-off means may include for each bipolar transistor present a resistor for coupling its base to the first circuit supply terminal. At least one diode may be arranged in series with the pull-off means for preventing the base of the associated bipolar transistor from being discharged completely. The diode's presence gives rise to a reduced voltage swing at the base of the bipolar transistor, and consequently to an increase in the circuit's speed. Preferably each diode is of the Schottky-type because of its lower forward-bias voltage compared to a pn-diode, thereby providing an adequate pull-off without a complete discharge.

BRIEF DESCRIPTION OF THE DRAWING

The invention will be explained hereinafter in further detail and by way of example with reference to the accompanying drawing in which:

FIG. 4 shows a first example of a memory element according to the invention; and FIG. 5 shows a second example of a memory element according to the invention.

Throughout the figures the same reference numerals will be used for identical or corresponding components for the sake of brevity.

DESCRIPTION OF THE PREFERRED EMBODIMENTS

Figure 1:
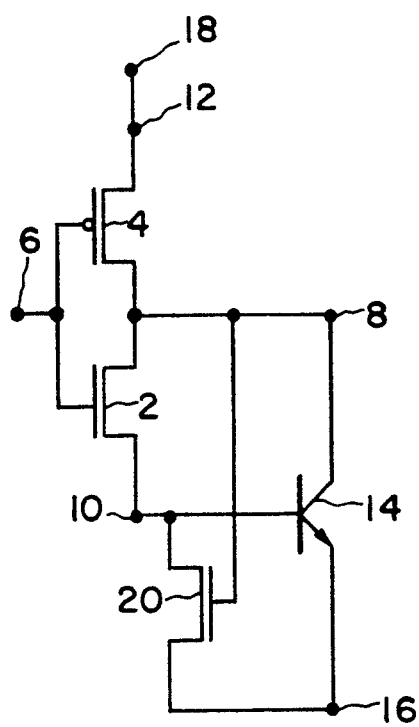
FIG. 1 shows a first example of a logic gate for use in a memory element according to the invention.

FIG. 1 shows a first example of a single logic gate for use in a circuit according to the invention. Field effect transistors 2 and 4, being of mutually complementary polarity type, constitute a logic inverter configuration having an input node 6, an output node 8, a first gate supply node 10 and a second gate supply node 12. An npn bipolar transistor 14 has its base connected to first gate supply node 10, its collector to output node 8 and its emitter to a first circuit supply node 16. A second gate supply node 12 is connected to second circuit supply node 18. A pull-off transistor 20, that is smaller than transistor 2, has its main current path connected between first gate supply node 10 and first circuit supply node 16, and has its control electrode connected to output node 8.

Upon a signal transition from a low voltage to a high voltage at input node 6, P-channel transistor 4 turns off and N-channel transistor 2 turns on. Consequently, the charge stored at output node 8 is distributed between output node 8 and first gate supply node 10, thereby enabling pull-off transistor 20, that is conducting, to be overpowered. As a result, the voltage at the base electrode of transistor 14 starts to rise. Accordingly, transistor 14 turns on and conducts a main current from its collector to its emitter, receiving its base current through transistor 2. In fact, the initial discharge current through transistor 2 is multiplied and appears as the discharge current through transistor 14. Output node 8 will be discharged until the voltages at output node 8 and at first gate supply node 10 have dropped sufficiently far to turn transistors 14 and 20 off. It should be noted that making pull-off transistor 20 small, as mentioned above, involves several operational aspects. First, it enables pull-off transistor 20 to be overpowered by transistor 2. Second, it reduces the capacitive load at node 10. And third, it reduces the current that is stolen from the base of transistor 14 and that would not have contributed to the amplification of the discharge current from node 8 to node 16.

Upon a signal transition from a high voltage to a low voltage at input node 6, N-channel transistor 2 turns off and P-channel transistor 4 turns on while transistors 14 remains turned off. The discharging paths being blocked, the voltage at output node 8 rises from low to high.

Figure 2:
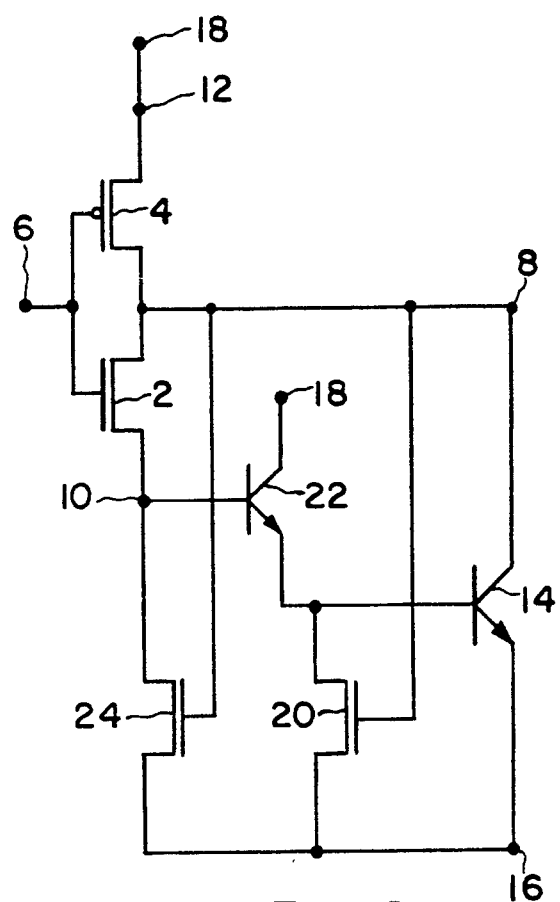
FIG. 2 shows a second example of a logic gate for use in a memory element according to the invention.

It should be mentioned that pull-off transistor 20 may be left out in another version of the gate since the bipolar transistor's base current flows through the emitter towards first circuit supply node FIG. 2 shows a second example of a logic gate for use in a circuit according to the invention. The elements 2 to 20 are similar to and operable the same as those of FIG. 1. With regard to the circuit of FIG. 1, first gate supply node 10 now is coupled to the base of transistor 14 via a base-emitter path of an npn current amplifier transistor 22. Transistor 22 has its collector connected to second circuit supply node 18. The discharge current through transistor 2 now functions as the base current for transistor 22, which, in turn, outputs a magnified current. This magnified current is fed to the base of transistor 14. An additional pull-off transistor 24 has its main current path connected between first gate supply node 10 and first circuit supply node 16. Like pull-off transistor 20, pull-off transistor 24 is controlled by output node 8. Preferably, pull-off transistor 24 is small compared to transistor 2 for similar reasons as mentioned with regard to transistor 20 in FIG. 1.

Although in this example pull-off transistor 24 has been drawn to connect first gate supply node 10 to first circuit supply node 16, in another embodiment (not shown) pull-off transistor 24 may instead connect first gate supply node 10 to the base of transistor 14. In this latter connection, transistor 24 experiences a lower voltage across its channel than in the shown connection when node 10 is charged. As a consequence, transistor 24 may then draw an advantageously smaller current than the corresponding transistor 24 in FIG. 2.

Figure 3:
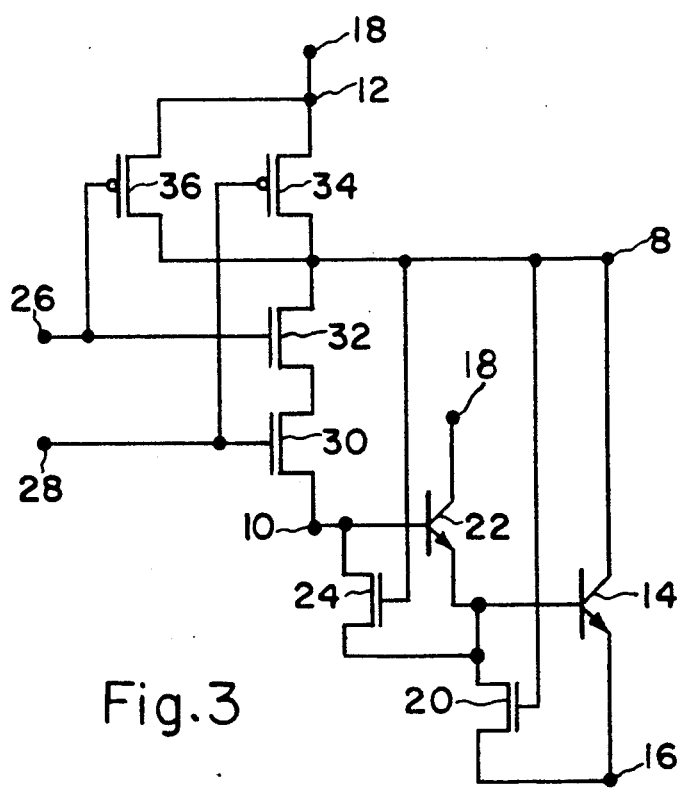
FIG. 3 shows a third example of a logic gate for use in a memory element according to the invention.

FIG. 3 shows a third example of a logic gate for use in a circuit according to the invention. Now, the logic gate is a NAND gate having input nodes 26 and 28, N-channel transistors 30 and 32 and P-channel transistors 34 and 36 connected as shown. The logic gate further contains FETs 20 and 24, and bipolar transistors 14 and 22 that are interconnected and operable as in the just mentioned alternative version of FIG. 2. Again, the discharging of output 8 via transistor 14 is controlled by the voltage at first gate supply node 10 via current amplifier transistor 22. In this example pull-off transistor 24 connects first gate supply terminal 10 to the base of transistor 14, so that upon a low-to-high transition at output node 8 transistor 20 discharges both first gate supply node 10 and the base of transistor 14.

FIG. 4 shows a first example of a memory element according to the invention, combining two NAND gates of FIG. 3. The various components are indicated with the same reference numerals as in FIG. 3 except for the suffices a and b that, each refer to a particular NAND gate. The NAND gates are cross-coupled, that is, each gate has an input 28a, 28b connected to an output 8b, 8a of the other gate. Each gate receives at its other input 26a, 26b a respective input quantity referred to as A and B, respectively. Associated output quantities at outputs 8a, 8b are referred to as P and Q, respectively.

The combination of cross-coupled NAND-gates may be used as an arbiter as will be explained below. Table I in the drawing gives the logic levels of output quantities P and Q as a function of the logic levels of input quantities A and B.

A signal, i.e., information, is defined as a transition from a logic low level (0) to a logic high level (1). Initially, when both A and B are low both P and Q are high according to Table I. When a signal arrives first at input node 26a, A changes from low to high, and consequently, P changes from high to low. Mutatis mutandis, the same holds good for B and Q. If thereupon a second signal arrives at the other input node 26b, it will not affect the output state that was already set by the first signal.

Input state A=1 and B=1 can only be attained from the initial state A=0 and B=0 through one of the intermediate states A=1 and B=0, or A=0 and B=1. Each intermediate state gives rise to an unique output state that is representative of the signal that was to arrive first.

If, however, the signals arrive substantially simultaneously a metastable state is created. In a circuit according to the invention this metastable state rapidly resolves stochastically into one of the stable states. This resolution shows an exponential dependence on time and involves a characteristic parameter indicative of a gate delay. As a consequence, a small reduction of this delay greatly increases the circuit's immunity to metastable states.

The presence of transistors 14a and 14b (and of the supporting transistors 20a, 20b, 22a, 22b, 24a and 24b) together with the optimized sizes of transistors 34a and 34b highly increases the memory element's immunity to metastable states. Preferably, the output (8a, 8b) of each gate is connected to the control electrode of a FET (30b, 30a) that has its source electrode connected to the base of a bipolar transistor (22b, 22a). In this way, the capacitive coupling between the associated input terminal (28b, 28a) and the base of the respective bipolar transistor (22b, 22a) helps activating the discharging process.

Instead of logic NAND gates in the above example the arbiter may comprise logic NOR gates. The arbiter is then triggered by a transition from logic high to logic low that is the first to occur at one of the arbiter's inputs.

FIG. 5 shows a second example of a memory element according to the invention. The element comprises two cross-coupled inverting structures related to the kind discussed with reference to FIG. 2. The various components are indicated with the same reference numerals as in FIG. 2, except for the suffices a and b that each refer to a particular inverting structure. The only difference is the connection of pull-off transistors 24a and 24b to the bases of respectively transistors 14a and 14b in FIG. 5. This way of interconnecting reduces the voltage across transistors 24a and 24b and as a consequence the current conducted thereby. The other components in each inverting structure are connected and operable as in FIG. 2.

Again, transistors 14a, 14b, 20a, 20b, 22a, 22b, 24a and 24b, together with the optimized sizes of transistors 4a and 4b highly increase the cross-coupled structure's immunity to metastable states.

The memory element in FIG. 5 is provided with a write circuit 40. Write circuit 40 comprises data input 42 and enable input 44. Data input 42 controls switch FET 46 directly and switch FET 48 through inverter 50. Enable input 44 controls switch FETs 52 and 54. FETs 46 and 52 are connected in series between output node 8a and the base of bipolar transistor 56. Transistor 56 has its collector connected to output node 8a and its emitter to first circuit supply node 16. FETs 48 and 54 are connected in series between output node 8b and the base of bipolar transistor 58. Transistor 58 has its collector connected to output node 8b and its emitter to first circuit supply node 16. FET 60 is arranged in parallel with the base-emitter path of transistor 56 and is controlled by output node 8a. FET 62 is arranged in parallel with the base-emitter path of transistor 58 and is controlled by output node 8b. FET 60 is smaller than FETs 46 and 52, and Fet 62 is smaller than FETs 48 and 54.

Because of the symmetry of the circuit of FIG. 5, its operation with regard to the writing circuit 40 will now be described with reference to a state wherein node 8a carries a logic high and node 8b carries a logic low. Therefore FET 60 is turned on and FET 62 is turned off. The new information to be written into the memory element is supplied by data input 42 carrying a logic high. As a consequence, FET 46 is conducting and FET 48 is blocked. If enable input 44 carries a logic high FETs 52 and 54 both are conducting. Thus, node 8a is connected to the base of transistor 56. Since FET 60 is smaller than FETs 46 and 52, FET 60 is overpowered and transistor 56 is turned on, thereby providing a rapid discharge path between node 8a and node 16. As a result, node 8a is pulled to logic low turning FET 4b on and FET 2b off. Node 8b is thereupon charged to a logic high. Since FETs 48 is turned off and FET 62 is turned on, the discharge path between node 8b and node 16 is blocked. The new output states therefore are a logic low at node 8a and a logic high at node 8b, which are attained fast due to the rapid discharging through bipolar transistor 14a and the rapid charging through FET 4b.

In the drawing each logic gate is shown to be coupled to only one of the circuit supply nodes via a base-emitter path. However, it is to be understood that the invention covers as well those embodiments, wherein each gate is coupled to both circuit supply nodes via respective base-emitter paths. For example, according to the invention a logic gate with an N-channel FET and a P-channel FET may have the source of the N-channel FET coupled to the first circuit supply node via the base-emitter path of an npn bipolar transistor, and the source of the P-channel FET coupled to the second circuit supply node via a base-emitter path of a pnp bipolar transistor.